United States Patent
Matsunaga

(10) Patent No.: US 10,331,158 B2
(45) Date of Patent: Jun. 25, 2019

(54) ELECTRICAL UNIT

(71) Applicant: YAZAKI CORPORATION, Tokyo (JP)

(72) Inventor: Mototatsu Matsunaga, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/703,020

(22) Filed: Sep. 13, 2017

(65) Prior Publication Data
US 2018/0074541 A1 Mar. 15, 2018

(30) Foreign Application Priority Data

Sep. 14, 2016 (JP) .................. 2016-179825

(51) Int. Cl.
H05K 5/02 (2006.01)
G05F 5/00 (2006.01)
(Continued)

(52) U.S. Cl.
CPC .................. *G05F 5/00* (2013.01); *H02P 7/04* (2016.02); *H02P 27/06* (2013.01); *H05K 5/0247* (2013.01);
(Continued)

(58) Field of Classification Search
CPC ..... B60R 16/00; B60R 16/02; B60R 16/0207; B60R 2021/0104; H02P 7/04; H05K 5/0247; H01R 24/66; H01R 24/20
See application file for complete search history.

(56) References Cited

U.S. PATENT DOCUMENTS 7,572,149 B2 * 8/2009 Matsuura ............. H01R 12/616
439/620.21
8,817,576 B2 * 8/2014 Tsuzuki .................. G01S 7/521
367/118
(Continued)

FOREIGN PATENT DOCUMENTS

JP 7-95658 A 4/1995
JP 8-79841 A 3/1996
(Continued)

OTHER PUBLICATIONS

Japanese Office Action for the related Japanese Patent Application No. 2016-179825 dated Aug. 21, 2018.

*Primary Examiner* — Bickey Dhakal
(74) *Attorney, Agent, or Firm* — Kenealy Vaidya LLP

(57) ABSTRACT

An electrical unit relaying between an electrical component and an electronic control unit which determines a target operating amount of the electrical component, includes a communication port connectable with a communication wire connected to the electronic control unit, a power supply port connectable with a power supply wire connected to an external power supply, a ground port connectable with a ground wire, and one or more electrical component ports capable of supplying electric power to the electrical component. The electrical unit receives a signal relating to the target operating amount from the electronic control unit through the communication port. Electric power for operation according to the target operating amount is supplied to the electrical unit through the power supply port. The electrical unit supplies the electric power for operation to the electrical component through the electrical component ports.

4 Claims, 4 Drawing Sheets

(51) Int. Cl.
*H02P 27/06* (2006.01)
*H02P 7/03* (2016.01)
*H01R 24/20* (2011.01)
*H01R 24/66* (2011.01)
*H01R 107/00* (2006.01)

(52) U.S. Cl.
CPC .............. *H01R 24/20* (2013.01); *H01R 24/66* (2013.01); *H01R 2107/00* (2013.01); *H01R 2201/26* (2013.01)

(56) References Cited

U.S. PATENT DOCUMENTS

| | | | |
|---|---|---|---|
| 9,160,557 B2 * | 10/2015 | Itou | ................... H04L 12/40019 |
| 2008/0071447 A1 | 3/2008 | Uraki | |
| 2014/0111963 A1 * | 4/2014 | Satake | ................ B60R 16/0207 |
| | | | 361/826 |
| 2016/0373051 A1 * | 12/2016 | Kudanowski | ......... B60L 3/0084 |

FOREIGN PATENT DOCUMENTS

| | | |
|---|---|---|
| JP | 9-98635 A | 4/1997 |
| JP | 2011-151622 A | 8/2011 |
| JP | 2013-15987 A | 1/2013 |

* cited by examiner

ELECTRICAL UNIT

CROSS REFERENCE TO RELATED APPLICATIONS

This application claims priority from Japanese Patent Application No. 2016-179825 filed on Sep. 14, 2016, the entire contents of which are incorporated herein by reference.

BACKGROUND OF THE INVENTION

Field of the Invention

The present invention relates to an electrical unit that relays between an electrical component and an electronic control unit that determines a target operating amount of the electrical component.

Description of Related Art

Various types of electrical components are recently mounted on a vehicle such as an automobile, and the electrical components are generally disposed in various places on a vehicle body in a distributed manner. For example, an electrical component related to traveling of a vehicle, an electrical component related to an audio, an electrical component related to a function of the vehicle body, and the like are disposed in each place such as a steering column, a glove box, and a center cluster (and a center console). Each of such electrical components generally includes various switches, various sensors, various relays, and the like.

When such electrical component is operated, electric power is supplied from a power supply (for example, in-vehicle battery and alternator) in a vehicle side to the electrical component. Further, signals from switches, sensors, and the like included in the electrical component may be transmitted to various electronic control units (ECUs) included in a vehicle or other electrical components.

For example, one conventional electrical unit (hereinafter referred to as "conventional unit") is used as a slave communication unit, connected to a master ECU through an in-vehicle network. The conventional unit (slave communication unit) includes a calculation processing unit, calculates operating amounts of various electrical components by itself based on information or the like input from the various electrical components (for example, turn switch and head light), and controls the various electrical components by itself (for example, refer to Patent Document 1).
[Patent Document 1] JP-A-2011-151622

According to a related art, a conventional unit (slave communication unit) is designed to have a configuration corresponding to each of electrical components to be controlled such that the conventional unit can calculate and determine operating amounts of each of the electrical components by itself (that is, such that the conventional unit can operate each of the electrical components based on its own determination without depending on any instruction from a master ECU). In other words, the conventional unit is designed as a special part corresponding to specifications of electrical components to be controlled.

However, actual electrical component generally has various configurations depending on a vehicle type on which the electrical component is mounted, a grade, presence or absence of optional equipment, and the like. Therefore, when electrical units are prepared as special parts for each of the electrical components, there is concern that, for example, management of the electrical units is complicated and manufacturing costs of the electrical units increase. As a result, it is desirable to enhance the versatility of an electrical unit as much as possible from the viewpoints of, for example, the management and the manufacturing cost of the electrical unit.

SUMMARY

One or more embodiments provide an electrical unit having high versatility.

Means for Solving the Problem

In an aspect (1), one or more embodiments provide an electrical unit relaying between an electrical component and an electronic control unit which determines a target operating amount of the electrical component. The electrical unit includes a communication port connectable with a communication wire connected to the electronic control unit, a power supply port connectable with a power supply wire connected to an external power supply, a ground port connectable with a ground wire, and one or more electrical component ports capable of supplying electric power to the electrical component. The electrical unit receives a signal relating to the target operating amount from the electronic control unit through the communication port. Electric power for operation according to the target operating amount is supplied to the electrical unit through the power supply port. The electrical unit supplies the electric power for operation to the electrical component through the one or more electrical component ports.

In an aspect (2), the electrical unit further includes at least one of a switch port connectable with a signal wire connected to a switch relating to operation of the electrical component, and a sensor port connectable with a signal wire connected to a sensor measuring parameter relating to operation of the electrical component. The electrical unit transmits a signal received through at least one of the switch port and the sensor port to the electronic control unit through the communication port.

In an aspect (3), when the electrical component is a motor, the electrical unit supplies the electric power for operation to the motor through a full-bridge circuit having a half-bridge circuit. When the electrical component is a load other than a motor, the electrical unit supplies the electric power for operation to the load through half-bridge circuit.

In an aspect (4), the electrical unit is integrally molded with resin in a state that the communication port, the power supply port, the ground port, and the one or more electrical component ports are disposed on the same side of the electrical unit in an aligned manner.

In an aspect (5), the electrical unit further includes a connecting mechanism capable of directly connecting the electrical unit to the electrical component.

According to the aspect (1), the electrical unit includes a function for operating the electrical component. However, the electrical unit does not determine an operating amount of the electrical component by itself and operates the electrical component according to an instruction (a signal relating to a target operating amount) from an electronic control unit. In other words, the electrical unit does not make any determination by itself related to the operation of the electrical component and operates the electrical component according to only the instruction from the electronic control unit.

Accordingly, since a determining function related to the operation of the electrical component may be removed from the electrical unit with the configuration, the versatility is enhanced compared with the conventional unit. For example, in a case where the electrical component is a motor controlled by PWM, the electrical unit may have only a function of generating a pulse in accordance with the PWM control according to an instruction from an electronic control unit and of providing the generated pulse to the motor. Therefore, a common electrical unit may be used for various motors (that is, the versatility is enhanced).

As a result, the electrical unit with the configuration is excellent in the versatility.

Further, the electrical unit with the configuration described above has also other effects (simplicity of a structure). In a case where an electrical component is operated based on its own determination as in the conventional unit (slave communication unit), specifically, a control IC (for example, a microcomputer) configured to perform relatively complicated processing is generally incorporated in the electrical unit. On the other hand, in the electrical unit with the configuration described above, since the electrical component is operated according to an instruction from the electronic control unit (the determining function related to the operation of the electrical component may be removed), a configuration of the electrical component, even though the control IC is incorporated, may be simplified compared with that of the conventional unit. For example, the number of gate circuits (or gate ICs) may be reduced compared with the conventional unit. Further, for example, a logic IC having a simple configuration compared with a so-called microcomputer or the like may be used depending on processing content to be performed. As a result, in the electrical unit with the configuration described above, the structure may be simplified compared with the conventional unit.

The "target operating amount" of the electrical component described above is a concept including not only a target value of an operating amount (for example, a rotational speed of a motor) of the electrical component, but also target timing of the operating start and the operating stop (on/off) of the electrical component.

According to the aspect of (2), a signal from a switch and/or a sensor for operating the electrical component may be transmitted to the electronic control unit (without using its own determination). As a result, since such determining function may be removed, the versatility of the electrical unit is further enhanced compared with a case where the electrical unit determines by itself, based on the signal from the switch and/or the sensor, and performs on/off of the electrical component.

The electrical unit with the configuration may also be configured such that the electrical unit also receives a switch signal and/or a sensor signal and transmits the received signal to the electronic control unit (performs a so-called substitutional input), even for an electrical component different from the electrical component to be controlled (electrical component that the electrical unit relays a signal from an electronic control unit).

According to the aspect (3), a switching circuit for operating a motor may also be used for operating other loads. Therefore, the versatility of the electrical unit may be further enhanced compared with a case where different electrical units are prepared for each of the motor and the other loads.

As an example of the switching circuit in the electrical unit with the configuration described above, a full-bridge circuit (H-bridge circuit) and a half-bridge circuit are exemplified.

According to the aspect (4), the electrical unit is integrally molded with resin and various ports are aligned on the same side surface of the molded body (for example, having a connector form). Accordingly, it is easy to store the electrical unit, actually connect the electrical unit to the electronic control unit and the electrical component, and the like, compared with a case where components of the electrical unit are divided into multiple parts.

According to the aspect (5), the electrical unit may directly be connected to the electrical component. Therefore, a manufacturing cost of the entire system may be reduced compared with a case where the electrical unit and the electrical component are connected through an electric wire or the like.

According to the present invention, an electrical unit with the enhanced versatility can be provided.

The present invention has briefly been described above. Further, details of the present invention will be further clarified by reading thoroughly a mode for carrying out an invention (hereinafter referred to as "embodiment") described below with reference to accompanying drawings.

BRIEF DESCRIPTION OF THE DRAWINGS

FIG. 4A is a diagram illustrating operation of the driving unit in a case where an electrical component is a motor and FIG. 4B is a diagram illustrating operation of the driving unit in a case where the electrical component is a load other than a motor.

DETAILED DESCRIPTION

Hereinafter, an electrical unit 30 according to an embodiment of the present invention will be described with reference to drawings.

Figure 1:
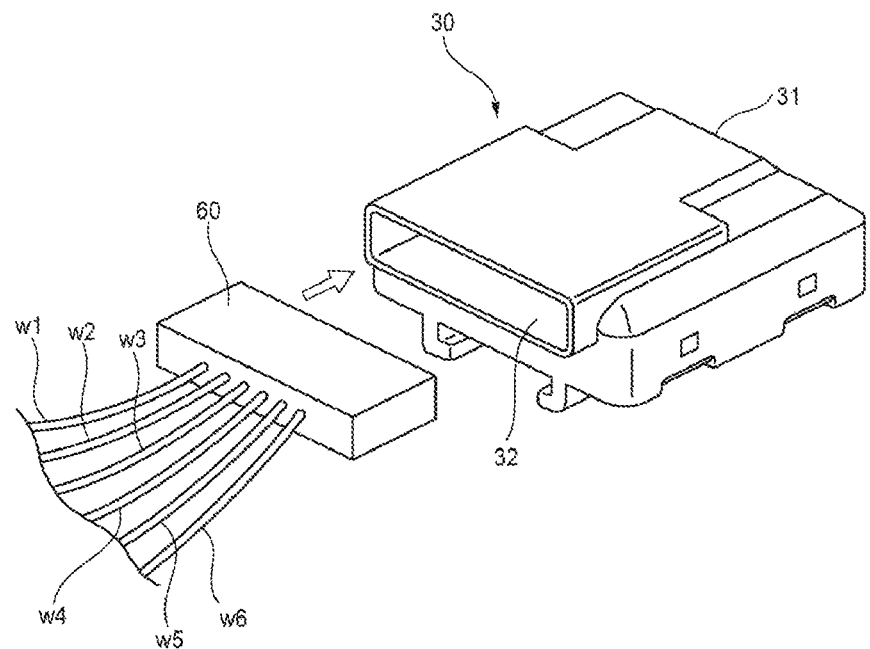
FIG. 1 is a perspective view of an electrical unit according to an embodiment of the present invention.

As illustrated in FIG. 1, the electrical unit 30 includes a housing 31, which is made of resin covering the entire electrical unit 30. The housing 31 incorporates a control IC (processing unit 33 illustrated in FIG. 3 described below) such as microcomputer, a switching device (FET. driving unit 34 illustrated in FIG. 3 described below), and the like.

A connector unit 32 is formed for engaging and connecting a mating connector 60 in the housing 31. Various ports P1 to P6 (also refer to FIG. 3) described below are disposed on the same side surface of the housing 31 in an aligned manner in the connector unit 32. In other words, in a state that the various ports P1 to P6 are disposed on the same side surface of the electrical unit 30 in the aligned manner (in a connector form), the electrical unit 30 is integrally molded with resin. The mating connector 60 is engaged and connected to the connector unit 32, so that the various ports P1 to P6 are respectively connected to various electric wires w1 to w6 connected to the mating connector 60.

Further, in the state that the mating connector 60 is engaged and connected to the connector unit 32 of the electrical unit 30, the electrical unit 30 relays between an electrical component 40 and an electronic control unit 20, and performs a function of operating the relaying electrical component 40 based on an instruction from the electronic control unit 20 as described below (also refer to FIGS. 2 and 3).

Next, an example of an electrical component system for a vehicle using the electrical unit 30 according to the embodiment of the present invention will be described with reference to FIG. 2. In the example illustrated in FIG. 2, two electrical units 30a, 30b are used as the electrical unit 30. However, the number of the electrical units 30 is not particularly limited, one, or three or more electrical units may be used.

Hereinafter, for convenience of description, a configuration/element related only to the electrical unit 30a is represented particularly by adding "a" to the end of a reference numeral and sign, and a configuration/element related only to the electrical unit 30b is represented particularly by adding "b" to the end of a reference numeral and sign. In a case where it is unnecessary to distinguish between "a" and "b" for description, "a" and "b" will be omitted. For electric wire, a main wire is represented by adding a capital letter "W" to the beginning of a reference numeral and sign, and an electric wire other than the main wire such as a branch wire branched from the main wire is represented by adding a small letter "w" to the beginning of a reference numeral and sign.

Figure 2:
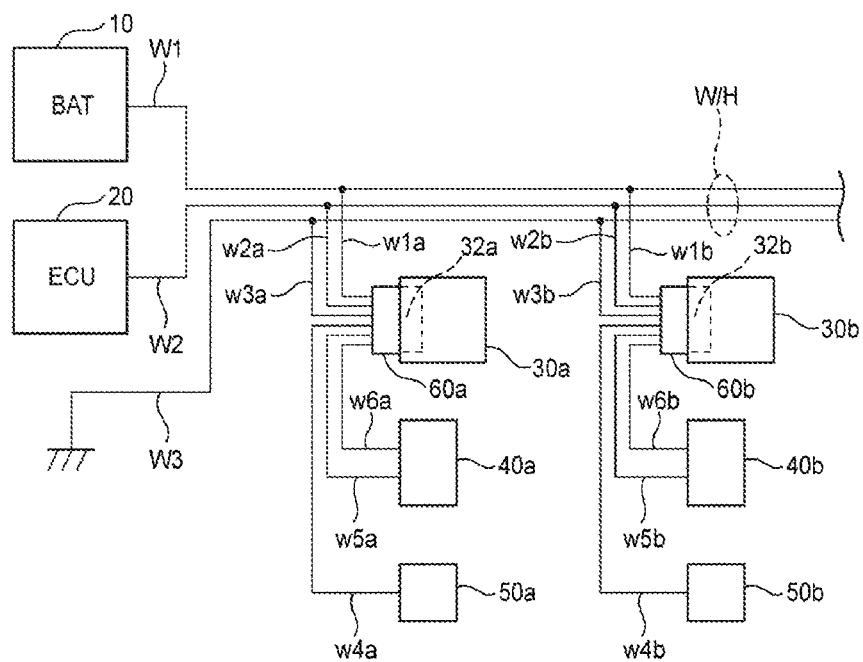
FIG. 2 is a block diagram illustrating an outline of an electrical component system using the electrical unit according to the embodiment of the present invention.

As illustrated in FIG. 2, the electrical component system includes a wire harness W/H configured to have a power supply wire W1, a communication wire W2, and a ground wire W3 as the main wires. The power supply wire W1 is connected to a battery 10 (BAT), which is a main power supply of a vehicle. For example, a DC voltage of +12 V is supplied, as electric power of a power supply, to the power supply wire W1.

The communication wire W2 is connected to an electronic control unit (ECU) 20 for controlling various types of electrical components, including the electrical component 40, mounted on a vehicle. The communication wire W2 performs a function of transmitting signals between the electronic control unit 20 and each electrical unit 30. The ground wire W3 is grounded and the potential is always 0 V.

One ends of power supply wires w1, communication wires w2, ground wires w3, signal wires w4, signal wires w5, and signal wires w6 are respectively connected to the mating connectors 60, which are connected to the connector units 32 of each electrical unit 30. The other ends of each power supply wire w1 are connected to the power supply wire W1 of the wire harness W/H, the other ends of each communication wire w2 are connected to the communication wire W2 of the wire harness W/H, and the other ends of each ground wire w3 are connected to the ground wire W3 of the wire harness W/H.

In a longitudinal direction of the wire harness W/H, connecting points between the other ends of a power supply wire w1a, a communication wire w2a, and a ground wire w3a and the power supply wire W1, the communication wire W2, and the ground wire W3 are different from connecting points between the other ends of a power supply wire w1b, a communication wire w2b, and a ground wire w3b and the power supply wire W1, the communication wire W2, and the ground wire W3. In other words, in the longitudinal direction of the wire harness W/H, the connecting points between the electrical unit 30a and the wire harness W/H are different from the connecting points between the electrical unit 30b and the wire harness W/H.

The other ends of each of the signal wires w5, w6 are connected to each of the electrical components 40, which are relayed by the corresponding electrical units 30. The other ends of each of the signal wires w4 are connected to switches relating to on/off of each of the electrical components 40, which are relayed by the corresponding electrical units 30, and/or sensors (hereinafter referred to as "switch and the like 50") which measure parameter relating to on/off of each of the electrical components 40, which are relayed by the corresponding electrical units 30.

The electrical component 40 is an electrical component (load) mounted on a vehicle and, specifically, indicates a motor, a lamp, a solenoid coil, and the like. As the motor, for example, a motor for driving an outer mirror, a motor for driving a seat belt anchor, and a motor for driving a sun shade are exemplified. As the lamp, a lamp for indoor foot lighting, a lamp for outdoor foot lighting, a lamp for roof lighting, and the like are exemplified. As the solenoid coil, for example, a solenoid coil used for various electromagnetic valves is exemplified.

The electrical components 40a, 40b may be the same kind of load (for example, motors) and may be different kinds of loads (for example, a motor and a lamp). A switch and the like 50a is a switch and the like relating to on/off of the electrical component 40a, and a switch and the like 50b is a switch and the like relating to on/off of the electrical component 40b.

Figure 3:
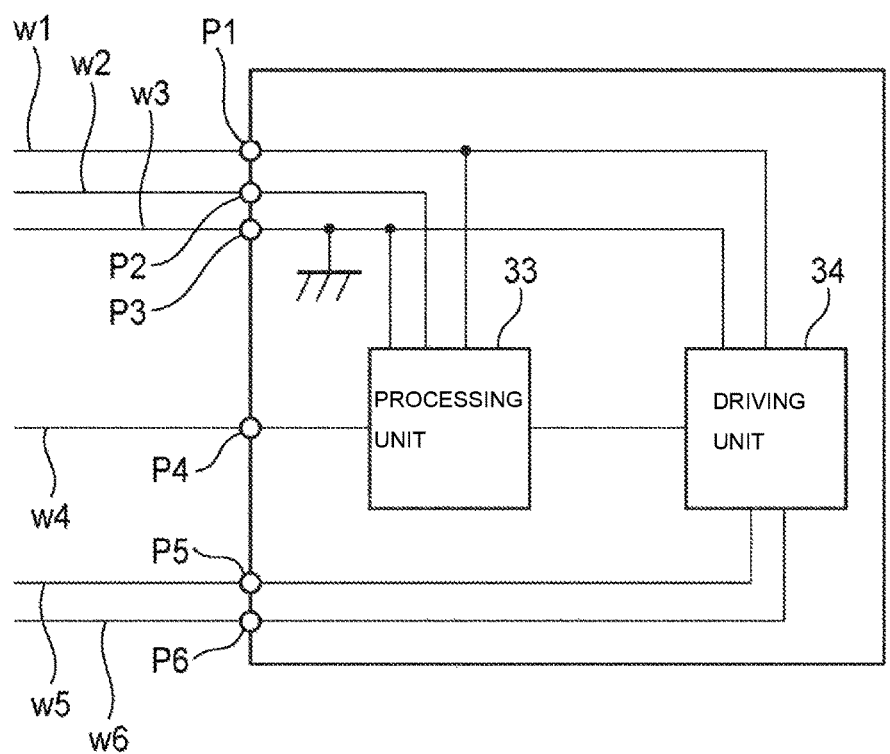
FIG. 3 is a functional block diagram of the electrical unit according to the embodiment of the present invention.

As illustrated in FIG. 3, each electrical unit 30 includes a power supply port P1, a communication port P2, a ground port P3, a signal port P4, a signal port P5, and a signal port P6 capable of respectively connecting the power supply wire w1, the communication wire w2, the ground wire w3, the signal wire w4, the signal wire w5, and the signal wire w6 of the mating connector 60.

The mating connector 60 is engaged and connected to the connector unit 32 of the electrical unit 30, so that the electric wires w1 to w6 and the ports P1 to P6 are connected at a time. In the engaged and connected state, the electrical unit 30a relays between the electrical component 40a and the electronic control unit 20, and operates the electrical component 40a based on an instruction of the electronic control unit 20. The electrical unit 30b relays between the electrical component 40b and the electronic control unit 20, and operates the electrical component 40b based on an instruction of the electronic control unit 20. Hereinafter, this will be described in detail.

As illustrated in FIG. 3, each electrical unit 30 includes the processing unit 33 configured to have the control IC such as a microcomputer and the driving unit 34 configured to have a plurality of switching devices (FETs). The processing unit 33 is connected to the power supply port P1, the communication port P2, the ground port P3, the signal port P4, and the driving unit 34. The driving unit 34 is connected to the power supply port P1, the ground port P3, the signal port P5, the signal port P6, and the processing unit 33.

The processing unit 33 provides a signal, which is received from the switch and the like 50 through the signal wire w4 and the signal port P4, to the electronic control unit 20 through the communication port P2, the communication wire w2, and the communication wire W2. The processing unit 33 may provide the signal to the electronic control unit 20 without performing any processing to the signal received from the switch and the like 50, or may provide the signal to the electronic control unit 20 after performing some processing (for example, smoothing of the signal) to the signal. The electronic control unit 20 that receives the signal from the switch and the like 50 determines a target operating amount of the electrical component 40 based on the signal, and provides a signal indicating the target operating amount to the processing unit 33 through the communication wire W2, the communication wire w2, and the communication port P2. The processing unit 33 that receives the signal from the electronic control unit 20 generates a driving signal based on the target operating amount, and provides the generated driving signal to the driving unit 34. Here, the target operating amount is a concept including a target value of an operating amount (for example, a rotational speed of a motor) of the electrical component 40 and target timing of on/off of the electrical component 40.

Figure 4A:
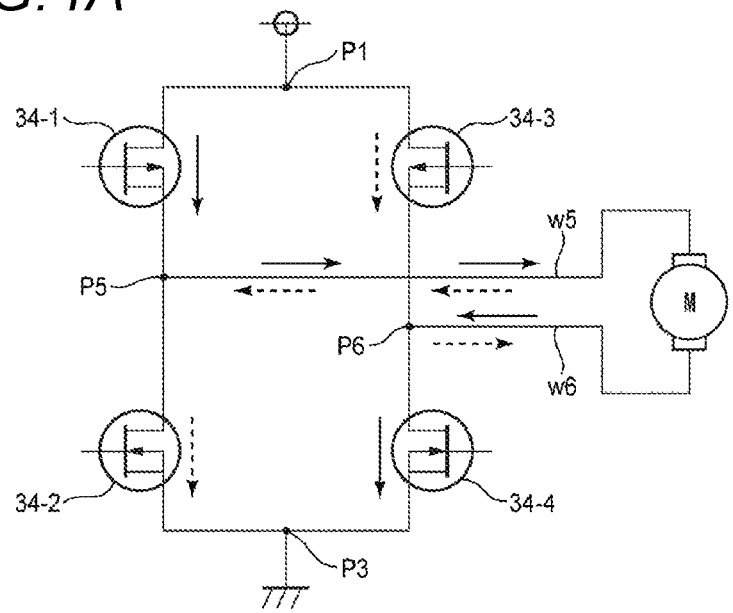
FIGS. 4A and 4B illustrate detail configurations of a driving unit in FIG. 3.

As illustrated in FIG. 4A, in a case where the electrical component 40 is a motor M capable of forward rotation and reverse rotation, the driving unit 34 may be configured to have a switching circuit (in this example, a full-bridge circuit. A so-called H-bridge circuit) including four switching devices (FETs) 34-1 to 34-4. Alternatively, the driving unit 34 may be configured to have a half-bridge circuit as the switching circuit.

In this example, in a case where the provided driving signal is a signal for driving the motor M to rotate forward, the FETs 34-1 and 34-4 are controlled to be turned on, and the FETs 34-2 and 34-3 are controlled to be turned off. As a result, electric current flows as indicated by solid arrows in FIG. 4A, and the motor M is driven to rotate forward.

On the other hand, in a case where the provided driving signal is a signal for driving the motor M to rotate reverse, the FETs 34-1 and 34-4 are controlled to be turned off, and the FETs 34-2 and 34-3 are controlled to be turned on. As a result, electric current flows as indicated by dashed arrows in FIG. 4A, and the motor M is driven to rotate reverse. In a case where it is necessary to control a rotational speed of the motor M, on/off timing of the FETs 34-1 to 34-4 is controlled to perform PWM control at a duty cycle based on a target value (target operating amount) of the rotational speed of the motor M.

Figure 4B:
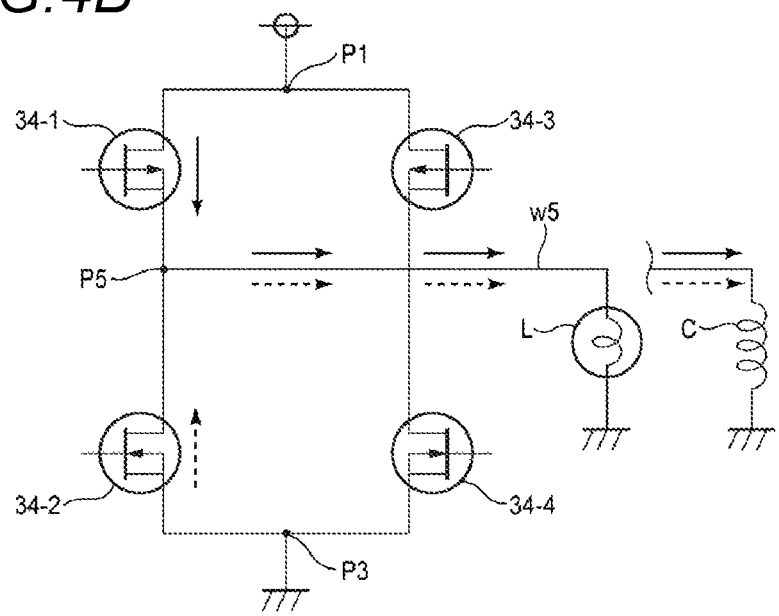

As illustrated in FIG. 4B, in a case where the electrical component 40 is a load other than a motor such as a lamp L or a solenoid coil C, the driving unit 34 may also be configured to have the switching circuit (H-bridge circuit), which is the same as the switching circuit illustrated in FIG. 4A.

In this case, in a case where the provided driving signal is a signal for turning on the lamp L and/or a signal for exciting the solenoid coil C, the FET 34-1 is controlled to be turned on, and the FETs 34-2, 34-3, and 34-4 are controlled to be turned off. As a result, electric current flows as indicated by solid arrows in FIG. 4B, and the lamp L is turned on and the solenoid coil C is excited. In a case where it is necessary to control brightness of the lamp L and a degree of excitation of the solenoid coil C, on/off timing of the FET 34-1 is controlled to perform PWM control at a duty cycle based on a target value (target operating amount) of the brightness of the lamp L and a target value of the degree of excitation of the solenoid coil C.

On the other hand, in a case where the provided driving signal is a signal for turning off the lamp L, the FETs 34-1 to 34-4 are controlled to be turned off. As a result, a potential difference applied to the lamp L becomes zero and then the lamp L is turned off. In a case where the provided driving signal is a signal for non-exciting the solenoid coil C, the FET 34-2 is controlled to be turned on and the FETs 34-1, 34-3, and 34-4 are controlled to be turned on. As a result, a potential difference applied to the solenoid coil C becomes zero and then the solenoid coil C is not excited.

In a case where the lamp L is switched from turn-on to turn-off, the electric current flowing to the lamp L becomes zero immediately after the switching time point. On the other hand, in a case where the solenoid coil C is switched from excitation to non-excitation, electric current caused by counter electromotive force of the solenoid coil C may flow to the solenoid coil C after the switching time point. In the case where the solenoid coil C is switched from excitation to non-excitation, the FET 34-2 is controlled to be turned on, as indicated by dashed arrows in FIG. 4B, so that the electric current caused by the counter electromotive force can be discharged through the FET 34-2. Accordingly, the FET 34-1 can be protected from the counter electromotive force.

In this manner, the electrical unit 30 receives a signal relating to a target operating amount from the electronic control unit 20 through the communication port P2, prepares electric power for operation according to the target operating amount using electric power obtained through the power supply port P1, and supplies the prepared electric power to the electrical component 40 through the electrical component ports P5, P6.

As described above, the electrical unit 30 according to the embodiment includes the function for operating the relaying electrical component 40. However, the electrical unit does not determine an operating amount of the electrical component by itself and operates the electrical component 40 according to an instruction from the electronic control unit 20. Accordingly, the versatility is enhanced compared with the conventional unit described in the background art section.

Further, since the electrical unit 30 operates the electrical component 40 according to an instruction from the electronic control unit 20 different from the conventional unit (the determining function related to the operation of the electrical component 40 can be removed), a configuration of the control IC (processing unit 33) can be simplified compared with that of the conventional unit. For example, the number of gate circuits (or gate ICs) can be reduced compared with that of the conventional unit. Further, for example, a logic IC having a simple configuration compared with a so-called microcomputer or the like can be used depending on processing content to be performed.

Further, the electrical unit 30 transmits a signal, from the switch and the like 50, for operating the relaying electrical component 40 (without using its own determination) to the electronic control unit 20. As a result, the versatility of the electrical unit 30 is enhanced compared with a case where the electrical unit 30 determines by itself based on the signal from the switch and the like 50 and performs on/off of the relaying electrical component 40.

Further, in the electrical unit 30, the switching circuit (refer to FIG. 4A) for operating the motor can also be used for operating other loads other than the motor (refer to FIG. 4B). Therefore, the versatility can be further enhanced compared with a case where different electrical units are prepared for each of the motor and the other loads. The full-bridge circuit (H-bridge circuit) is illustrated in FIG. 4B as the switching circuit, but even in a case where the half-bridge circuit is used as the switching circuit, the same effects (enhancement of the versatility) can be obtained, as can be understood from the above description.

Further, since the entire electrical unit 30 is integrally sealed with resin (in a connector form), it is easy to handle the electrical unit and connect the electrical unit 30 to the electronic control unit 20 and the electrical component 40.

Other Embodiments

The present invention is not limited to each embodiment described above, various modification examples can be employed within the scope of the present invention. For example, the present invention is not limited to the embodiment described above, the present invention may be modified, improved, or the like as necessary. In addition, a material, a shape, a dimension, the number, a disposed place, and the like of each configuration element in the embodiment described above are arbitrary and not limited as long as the present invention can be achieved.

For example, the present invention can be employed to circuits for a vehicle described in Japanese Patent Application No. 2016-131165 (filing date: Jun. 30, 2016), Japanese Patent Application No. 2016-131166 (filing date: Jun. 30, 2016), Japanese Patent Application No. 2016-131167 (filing date: Jun. 30, 2016), and the like, which are separately applied by this applicant.

Further, in the embodiment described above, the electrical unit 30 receives a signal, from the switch and the like 50, relating to on/off of the relaying electrical component 40. However, instead of this signal or in addition to this signal, the electrical unit may substitutionally receive a signal, from a switch and the like, relating to on/off of an electrical component different from the relaying electrical component 40, and transmit the received signal, from the switch and the like, to the electronic control unit 20.

Figure 5:
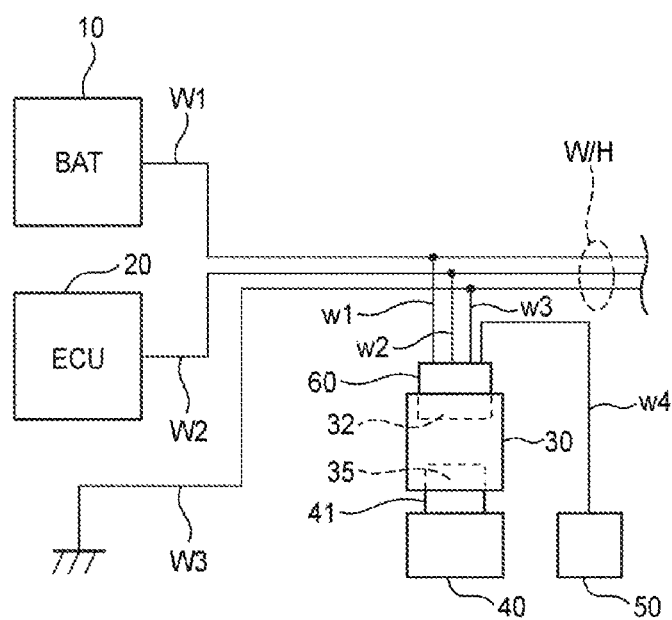
FIG. 5 is a diagram, corresponding to FIG. 2, of an electrical component system using an electrical unit according to a modification example of the embodiment of the present invention.

Further, in the embodiment described above, the electrical unit 30 and the electrical component 40 are connected through the signal wires w5, w6. However, as illustrated in FIG. 5, the electrical unit 30 and the electrical component 40 may directly be connected without any signal wire. This configuration, for example, can be realized by engaging and connecting a connector unit 41, disposed in the electrical component 40, to a second connector unit 35, disposed in the electrical unit 30. With the configuration, a cost can be reduced compared with the case where the electrical unit 30 and the electrical component 40 are connected through the electric wire or the like.

Further, in the embodiment described above, the electrical unit 30 provides a signal, from the switch and the like 50, received through the signal port P4 to the electronic control unit 20 through the processing unit 33. However, the electrical unit may provide the signal, from the switch and the like 50, received through the signal port P4 to the electronic control unit 20 without passing through the processing unit 33. In addition, the electrical unit 30 includes the signal port P4 connected to the switch and the like 50, but the electrical unit may not include the signal port P4. In this case, it may be configured such that the electronic control unit 20 directly receives a signal from the switch and the like 50.

Further, in the embodiment described above, the driving unit 34 of the electrical unit 30 is configured to have the full-bridge circuit (H-bridge circuit) in both cases where the electrical component 40 is the motor and the load other than the motor (refer to FIGS. 4(a) and 4(b)). However, the driving unit 34 of the electrical unit 30 may be configured to have the H-bridge circuit in a case where the electrical component 40 is a motor, and may be configured to have a circuit other than the full-bridge circuit (H-bridge circuit) in a case where the electrical component 40 is the load other than the motor.

Here, features of the embodiment of the electrical unit according to the present invention described above are briefly summarized in the following [1] to [5], respectively.
[1] An electrical unit (30) relaying between an electrical component (40) and an electronic control unit (20) which determines a target operating amount of the electrical component, the electrical unit comprising:

a communication port (P2) connectable with a communication wire (W2) connected to the electronic control unit (20);

a power supply port (P1) connectable with a power supply wire (W1) connected to an external power supply (10);

a ground port (P3) connectable with a ground wire (W3); and one or more electrical component ports (P5, P6) capable of supplying electric power to the electrical component, wherein the electrical unit receives a signal relating to the target operating amount from the electronic control unit (20) through the communication port (P2), wherein electric power for operation according to the target operating amount is supplied to the electrical unit through the power supply port (P1), and wherein the electrical unit supplies the electric power for operation to the electrical component (40) through the one or more electrical component ports (P5, P6).
[2] The electrical unit according to [1], further comprising:

at least one of a switch port (P4) connectable with a signal wire (w4) connected to a switch (50) relating to operation of the electrical component (40), and a sensor port (P4) connectable with a signal wire (w4) connected to a sensor (50) measuring parameter relating to operation of the electrical component (40), wherein the electrical unit transmits a signal received through at least one of the switch port and the sensor port to the electronic control unit (20) through the communication port.
[3] The electrical unit according to [1] or [2], wherein when the electrical component (40) is a motor, the electrical unit supplies the electric power for operation to the motor through a full-bridge circuit having a half-bridge circuit, and wherein when the electrical component (40) is a load other than a motor, the electrical unit supplies the electric power for operation to the load through half-bridge circuit.
[4] The electrical unit according to any one of [1] to [3], wherein the electrical unit is integrally molded with resin in a state that the communication port (P2), the power supply port (P1), the ground port (P3), and the electrical component ports (P5, P6) are disposed on the same side of the electrical unit in an aligned manner.
[5] The electrical unit according to any one of [1] to [4], further comprising:

a connecting mechanism (35, 41) capable of directly connecting the electrical unit (30) to the electrical component (40).

DESCRIPTION OF REFERENCE NUMERALS AND SIGNS

10: battery (external power supply)
20: electronic control unit
30: electrical unit
35: connector unit (connecting mechanism)
40: electrical component
41: connector unit (connecting mechanism)
50: switch and the like (switch, sensor)
P1: power supply port
P2: communication port
P3: ground port
P4: signal port (switch port, sensor port)
P5: signal port (electrical component port)
P6: signal port (electrical component port)
W1: power supply wire
W2: communication wire W3: ground wire
w4: signal wire
w5: signal wire
w6: signal wire

What is claimed is:

1. An electrical unit relaying between an electrical component and an electronic control unit which determines a target operating amount of the electrical component, the electrical unit comprising:
   a communication port connectable with a communication wire connected to the electronic control unit;
   a power supply port connectable with a power supply wire connected to an external power supply;
   a ground port connectable with a ground wire;
   one or more electrical component ports capable of supplying electric power to the electrical component; and
   a switch port connectable with a signal wire connected to a switch relating to on/off of the electrical component.
   wherein the electrical unit receives a signal relating to the target operating amount from the electronic control unit through the communication port,
   wherein electric power for operation according to the target operating amount is supplied to the electrical unit through the power supply port,
   wherein the electrical unit supplies the electric power for operation to the electrical component through the one or more electrical component ports,
   wherein the electrical unit transmits a signal received through the switch port to the electronic control unit through the communication port, and
   wherein the electronic control unit determines the target operating amount based on the signal received through the switch port.

2. The electrical unit according to claim 1,
   wherein when the electrical component is a motor, the electrical unit supplies the electric power for operation to the motor through a full-bridge circuit having a half-bridge circuit, and
   wherein when the electrical component is a load other than a motor, the electrical unit supplies the electric power for operation to the load through half-bridge circuit.

3. The electrical unit according to claim 1,
   wherein the electrical unit is integrally molded with resin in a stat that the communication port, the power supply port, the ground port, the switch port, and the one or more electrical component ports are disposed on the same side of the electrical unit in an aligned manner.

4. The electrical unit according to claim 1, further comprising:
   a connecting mechanism capable of directly connecting the electrical unit to the electrical component.

* * * * *